(12) United States Patent
Otani (10) Patent No.: US 6,924,537 B2
(45) Date of Patent: Aug. 2, 2005

(54) SEMICONDUCTOR DEVICE INCLUDING A POTENTIAL DRAWING PORTION FORMED AT A CORNER

(75) Inventor: Hiroshi Otani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/786,543

(22) Filed: Feb. 26, 2004

(65) Prior Publication Data
US 2005/0012165 A1 Jan. 20, 2005

(30) Foreign Application Priority Data
Jul. 16, 2003 (JP) ......................................... 2003-197506

(51) Int. Cl.[7] .............................................. H01L 29/84
(52) U.S. Cl. ...................................................... 257/414
(58) Field of Search ................................. 257/352, 414, 257/415, 416, 417, 418, 419, 420, 641, 700, 701

(56) References Cited

U.S. PATENT DOCUMENTS

| | | | |
|---|---|---|---|
| 4,391,032 A | * | 7/1983 | Schulte |
| 5,349,858 A | * | 9/1994 | Yagi et al. |
| 5,545,912 A | * | 8/1996 | Ristic et al. |

FOREIGN PATENT DOCUMENTS

| | | |
|---|---|---|
| JP | 5-142252 | 6/1993 |
| JP | 5-340961 | 12/1993 |
| JP | 10-104265 | 4/1998 |

OTHER PUBLICATIONS

Wolf and Tauber, "Silicon Processing for the VLSI Era, vol. 2—Process Integration," Lattice Press, 2000, p. 851–852.*

* cited by examiner

Primary Examiner—Nathan J. Flynn
Assistant Examiner—Kevin Quinto
(74) Attorney, Agent, or Firm—Oblon, Spivak, McClelland, Maier & Neustadt, P.C.

(57) ABSTRACT

A first semiconductor substrate (3) is so formed as to surround a periphery of a region between an upper substrate (1) and a lower substrate (11) like an outer peripheral frame, a potential drawing portion (31) of the first semiconductor substrate (3) is formed at a corner portion thereof and an area of the corner portion of the first semiconductor substrate (3) including the potential drawing portion (31) is made equal to or less than an area of each of potential drawing portions (36a, 36b, 40) of other semiconductor substrates (5, 7, 9), to achieve reduction in chip size. A conductive layer is formed on a surface of the upper substrate (1) or the like and the conductive layer is fixed to a fixed voltage such as a ground potential. This conductive layer or the like shields the semiconductor substrates against disturbance such as proximity of other substances, static electricity or radio wave hindrance.

9 Claims, 11 Drawing Sheets

SEMICONDUCTOR DEVICE INCLUDING A POTENTIAL DRAWING PORTION FORMED AT A CORNER

BACKGROUND OF THE INVENTION

1. Field of the Invention

The present invention relates to a semiconductor device used for an acceleration sensor, an angular velocity sensor, an electrostatic actuator or the like.

2. Description of the Background Art

In an inertial force sensor, an acceleration sensor, an angular velocity sensor, an electrostatic actuator or the like, conventionally, variation in static capacitance between a moving element and a stator in a case where the moving element and the stator are adjacently disposed, being spaced, and the moving element is moved has been detected as shown in, e.g., Japanese Patent Application Laid-Open Nos. 05-340961, 10-104265, and 05-142252.

In this case, as the moving element used is a semiconductor device having a silicon microstructure of triple-layered structure consisting of glass, silicon and glass, in which potentials of constituent elements are drawn out through holes in one of the glasses.

As to drawing of potentials of constituent elements made of silicon, conventionally, through holes are formed on one of the glasses and electrode pads are exposed in these through holes, to which wires are bonded.

Such a drawing structure with electrodes, however, needs a size of through hole large enough to accommodate a bonding tool (capillary) and disadvantageously has a limitation on reduction in chip size.

Further, in general, while a capacitance of the silicon microstructure is about 0.5 pF, the amount of variation in static capacitance in accordance with the inertial force, the acceleration or the like is about a tenth of the capacitance and this requires detection of very small static capacitance. On the other hand, when other substance approaches the silicon microstructure, an electric flux line of the capacitance in the silicon microstructure changes and a value of static capacitance disadvantageously changes regardless of the inertial force, the acceleration or the like. Furthermore, the same problem of variation in static capacitance is also caused by influence of electric charges such as static electricity or influence of disturbance such as radio wave hindrance. Therefore, there has been a possibility that it becomes hard to measure the inertial force, the acceleration or the like with high accuracy.

SUMMARY OF THE INVENTION

It is an object to provide a semiconductor device which allows reduction in chip size and less variation in static capacitance due to influence of disturbance.

According to the present invention, a semiconductor device includes an upper substrate, a lower substrate and a plurality of semiconductor substrates. On the upper substrate, a plurality of through holes are formed. A plurality of semiconductor substrates are provided between the upper substrate and the lower substrate. The plurality of semiconductor substrates form a fixed electrode and a variable electrode. On the plurality of semiconductor substrates, potential drawing portions are formed, abutting on the through holes to draw potentials, respectively. One of the plurality of semiconductor substrates is so formed as to surround a periphery of a region between the upper substrate and the lower substrate, like an outer peripheral frame. The others of the plurality of semiconductor substrates are disposed, being surrounded by an inner periphery of the one semiconductor substrate which is formed like an outer peripheral frame. The potential drawing portion of the one semiconductor substrate is formed at a corner portion thereof. An area of the corner portion of the one semiconductor substrate including the potential drawing portion is almost equal to or less than an area of each of the potential drawing portions of the other semiconductor substrates.

It is thereby possible to achieve reduction in chip size.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
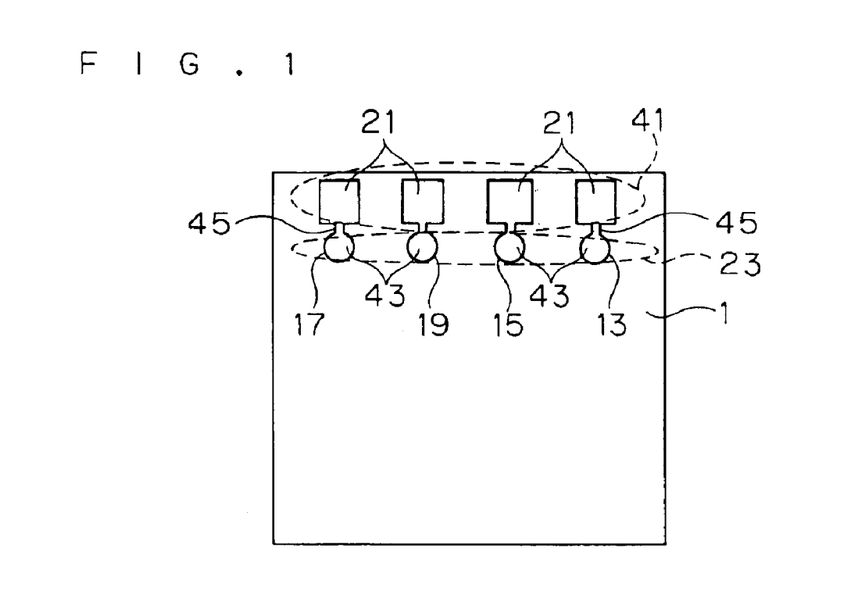
FIG. 1 is a plan view showing a microstructure in accordance with a first preferred embodiment of the present invention.
Figure 2:
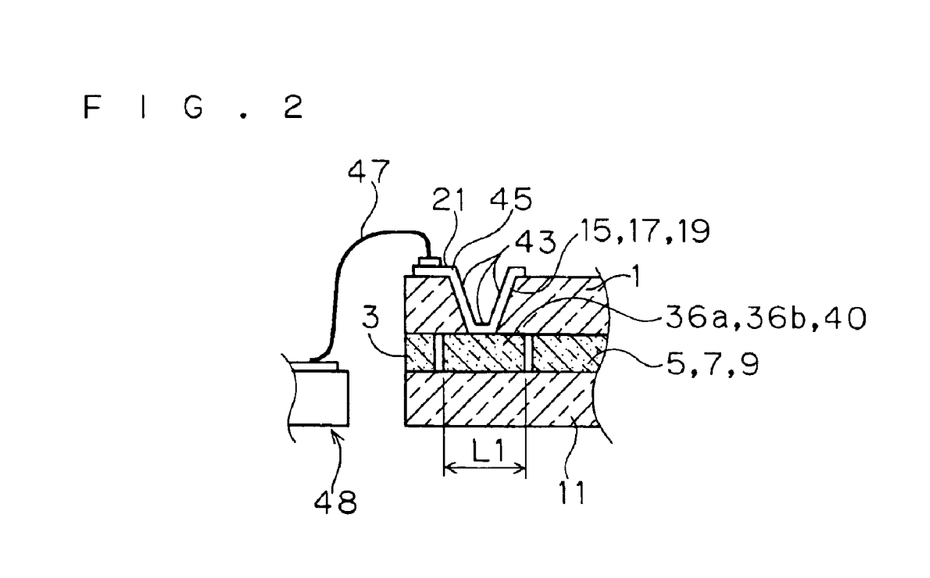
FIG. 2 is a side sectional view showing the microstructure in accordance with the first preferred embodiment of the present invention.
Figure 3:
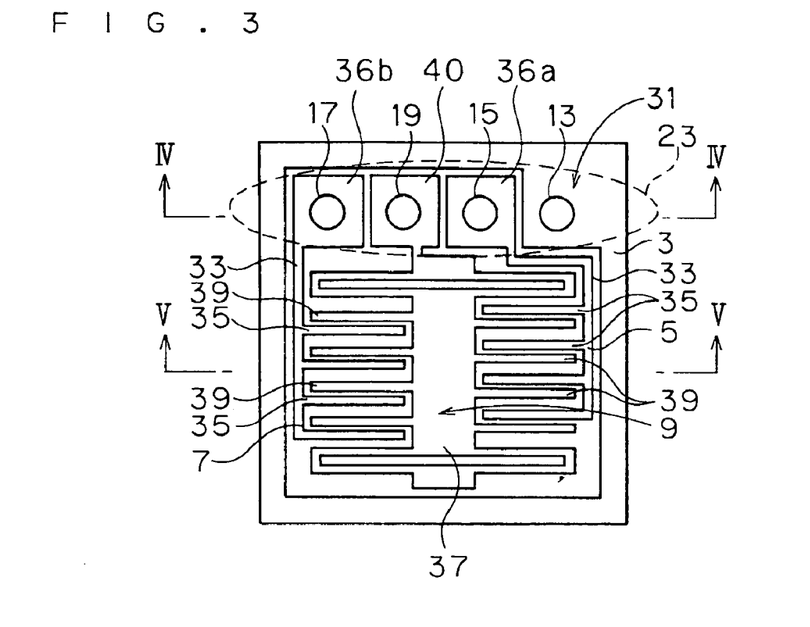
FIG. 3 is a plan view showing the microstructure in accordance with the first preferred embodiment of the present invention with an upper substrate removed.
Figure 4:
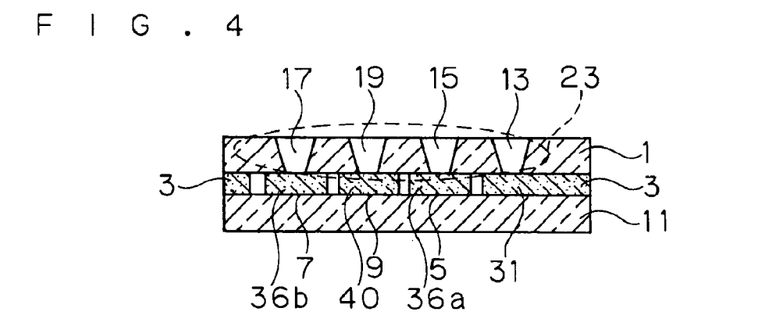
FIG. 4 is a cross section taken along the line IV—IV of FIG. 3.
Figure 5:
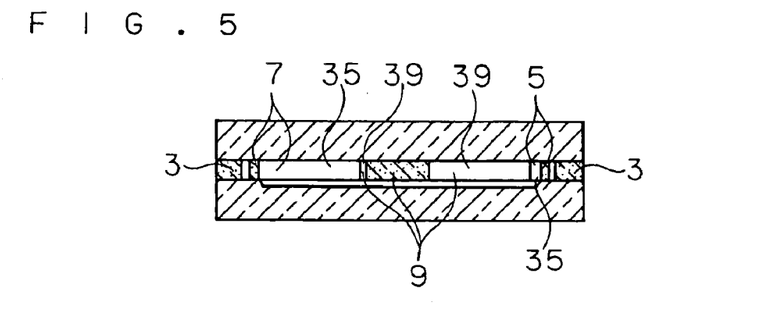
FIG. 5 is a cross section taken along the line V—V of FIG. 3.

FIG. 1 is a plan view showing a semiconductor device (microstructure) in accordance with the first preferred embodiment, in relation to a basic structure of preferred embodiments discussed later, FIG. 2 is a side sectional view showing the microstructure, FIG. 3 is a plan view showing the microstructure with an upper substrate removed, FIG. 4 is a cross section taken along the line IV—IV of FIG. 3 and FIG. 5 is a cross section taken along the line V—V of FIG. 3.

The microstructure is a silicon microstructure to be used for an inertial force sensor, an acceleration sensor, an angular velocity sensor, an electrostatic actuator or the like and has a triple-layered structure where an upper glass substrate (hereinafter, referred to as an "upper substrate") 1, semiconductor substrates 3, 5, 7 and 9 each made of silicon and a lower glass substrate (hereinafter, referred to as a "lower substrate") 11 are layered, as shown in FIGS. 1 to 5, in which potentials of the respective semiconductor substrates 3, 5, 7 and 9 in constituent elements are drawn to bonding pad portions 21 on a surface of the upper substrate 1 through the through holes 13, 15, 17 and 19 bored in some portions of the upper substrate 1.

The upper substrate 1 and the lower substrate 11 are formed of plate-like glass bodies, respectively, having the same area and so disposed as to sandwich a plurality of semiconductor substrates 3, 5, 7 and 9. In predetermined portions of the upper substrate 1, the above-described through holes 13, 15, 17 and 19 are bored. The through holes 13, 15, 17 and 19 are formed in a line, e.g., in a potential drawing region 23 which is linearly provided on the upper substrate 1.

Among the semiconductor substrates 3, 5, 7 and 9, the first semiconductor substrate 3 is so formed as to surround four sides of the microstructure having a rectangular shape in a plan view, like an outer peripheral frame, becoming an outer peripheral frame portion, and is fixed to a ground (GND) potential, serving as a fixed electrode which is not moved relatively to the glass substrates 1 and 11. Thus, since the first semiconductor substrate 3 which becomes the outer peripheral frame portion serves as a fixed electrode, it is possible to produce an antistatic effect on its sides.

A potential drawing portion 31 having a two-dimensionally rectangular shape or the like of a predetermined area is so formed at a position belonging to the potential drawing region 23, which is a corner portion of the first semiconductor substrate 3, as to protrude towards the inside in a plan view. An area of the potential drawing portion 31 is set almost equal to an area of each of potential drawing portions 36a, 36b and 40 of the other semiconductor substrates 5, 7 and 9 discussed later, as shown in FIG. 3.

Further, the second and third semiconductor substrates 5 and 7 are so disposed as to be surrounded by an inner periphery of the first semiconductor substrate 3 formed like an outer peripheral frame, being out of contact with the first semiconductor substrate 3, and serve as fixed electrodes which are fixed relatively to the glass substrates 1 and 11. The second and third semiconductor substrates 5 and 7 each have a basic piece 33 wired along the inside of the first semiconductor substrate 3 serving as an outer peripheral frame portion and two-dimensionally comblike fixing-side capacitance inductor elements 35 protruding towards the inside in a plan view from the basic piece 33 to cause induction in response to variation in static capacitance generated between the fourth semiconductor substrate 9 and themselves. At end portions of the second and third semiconductor substrates 5 and 7 which are positions belonging to the potential drawing region 23, potential drawing portions 36a and 36b each having a two-dimensionally rectangular shape of a predetermined area are formed.

The fourth semiconductor substrate 9 is a variable electrode which is movable relatively to the glass substrates 1 and 11 and so disposed as to be surrounded by the inner periphery of the first semiconductor substrate 3 formed like an outer peripheral frame, having a trunk portion 37 disposed at the center in a plan view and variable-side capacitance inductor elements 39 protruding towards both sides in a plan view from the trunk portion 37 to cause induction in response to variation in static capacitance generated between the fixing-side capacitance inductor elements 35 of the second and third semiconductor substrates 5 and 7 and themselves. At an end portion of the fourth semiconductor substrate 9 which is a position belonging to the potential drawing region 23, a potential drawing portion 40 having a two-dimensionally rectangular shape of a predetermined area is formed.

The bonding pad portions 21 are disposed at four positions in a line, respectively, in a connection region (potential drawing portion) 41 provided at an end portion of the upper substrate 1 in a plan view adjacently to the potential drawing region 23, as shown in FIG. 1. By extending some parts 45 of interconnection layers 43 which are so formed as to fill the through holes 13, 15, 17 and 19 on the upper substrate 1 and connecting these parts 45 to the bonding pad portions 21 as shown in FIGS. 1 and 2, the potential drawing portions 31, 36a, 36b and 40 immediately below the through holes 13, 15, 17 and 19, respectively, are electrically connected to the bonding pad portions 21. The bonding pad portions 21 and the interconnection layers 43 are formed by using the same metal paste, solder or the like at the same time.

In the microstructure of the first preferred embodiment, since potentials are drawn from the potential drawing portions 31, 36a, 36b and 40 immediately below the through holes 13, 15, 17 and 19 of the semiconductor substrates 3, 5, 7 and 9 to the bonding pad portions 21 on the upper substrate 1 through the interconnection layers 43 as discussed above, by connecting bonding wires 47 onto the bonding pad portions 21 on an upper surface of the upper substrate 1 as shown in FIG. 2, electrical drawing can be achieved with respect to the semiconductor substrates 3, 5, 7 and 9. Reference numeral 48 represents a semiconductor integrated circuit such as an ASIC.

Figure 6:
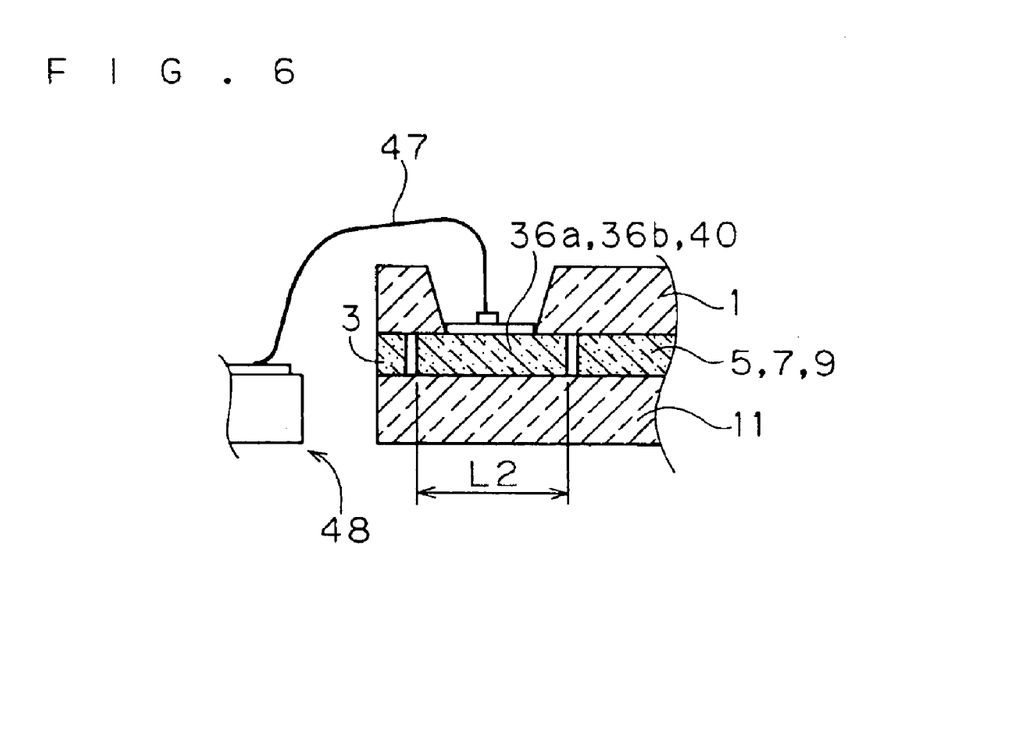
FIG. 6 is a side sectional view showing a case where a bonding wire is connected directly to a potential drawing portion immediately below a through hole.
Figure 7:
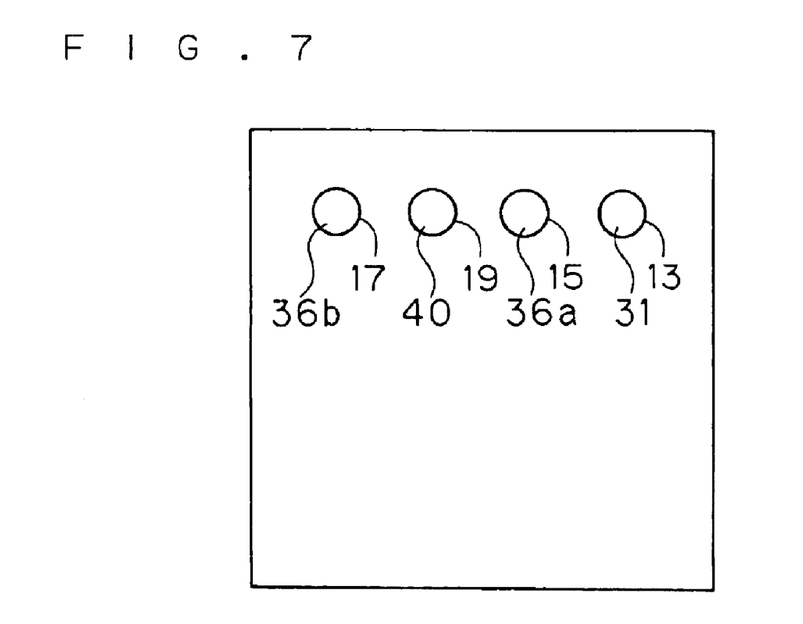
FIG. 7 is a plan view showing a case where bonding wires are connected directly to potential drawing portions immediately below through holes, respectively.

From comparison between the microstructure of the first preferred embodiment (FIG. 2) in which the bonding wires 47 are connected onto the bonding pad portions 21 on the upper substrate 1 as discussed above and a case (FIGS. 6 and 7) where the bonding wires 47 are connected directly to the potential drawing portions 31, 36a, 36b and 40 immediately below the through holes 13, 15, 17 and 19 without forming the bonding pad portions 21, it is found that the case of FIGS. 6 and 7 needs a size of each of the through holes 13, 15, 17 and 19 large enough to accommodate a bonding tool (capillary: not shown) for connection of the bonding wires 47 and this puts a limitation on reduction in chip size while the first preferred embodiment of FIG. 2 allows control of the bonding tool (capillary) on the upper surface of the upper substrate 1 to make connection of the bonding wires 47. Therefore, a diameter (L1 in FIG. 2) of each of the potential drawing portions 31, 36a, 36b and 40 can be made smaller than a diameter (L2) in the case of FIGS. 6 and 7, and this allows reduction in chip size.

In other words, since the potential drawing portion 31 of the first semiconductor substrate 3 is formed at the corner portion of the semiconductor device (microstructure) and an area of the corner portion of the first semiconductor substrate 3 including the potential drawing portion 31 is set almost equal to the area of each of the potential drawing portions 36a, 36b and 40 of the other semiconductor substrates 5, 7 and 9, it is possible to achieve reduction in chip size.

In the first preferred embodiment, the area of the corner portion of the first semiconductor substrate 3 including the potential drawing portion 31 is set almost equal to the area of each of the potential drawing portions 36a, 36b and 40 of the other semiconductor substrates 5, 7 and 9, and this includes a case where the area of the corner portion of the first semiconductor substrate 3 including the potential drawing portion 31 is slightly larger than the area of each of the potential drawing portions 36a, 36b and 40 of the other semiconductor substrates 5, 7 and 9 as well as the case where these areas are completely equal.

Further, the same effect can be produced even in a case where the area of the corner portion of the first semiconductor substrate 3 including the potential drawing portion 31 is smaller than the area of each of the potential drawing portions 36a, 36b and 40 of the other semiconductor substrates 5, 7 and 9.

The Second Preferred Embodiment

Figure 8:
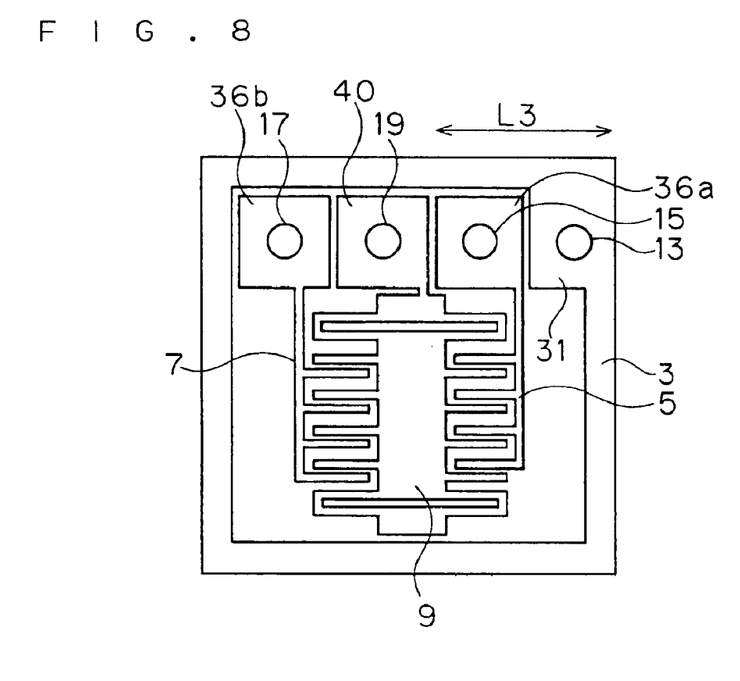
FIG. 8 is a plan view showing a microstructure in accordance with a second preferred embodiment of the present invention with the upper substrate removed.

FIG. 8 is a plan view showing a semiconductor device (microstructure) in accordance with the second preferred embodiment of the present invention with the upper substrate removed. In FIG. 8, constituent elements having the same functions as those of the first preferred embodiment are represented by the same reference signs.

As shown in FIG. 8, the microstructure of the second preferred embodiment has the same basic structure as that of the first preferred embodiment and the potential drawing portion 31 of the first semiconductor substrate (silicon body) 3 serving as an outer peripheral flame portion is formed at a corner portion in the potential drawing region 23 linearly defined in the microstructure.

In the first preferred embodiment, since the potential drawing portion 31 is so formed as to protrude towards the inside in a plan view from a frame portion of the first semiconductor substrate 3 serving as an outer peripheral frame portion and especially the area of the protruding potential drawing portion 31 is almost equal to the area of each of the potential drawing portions 36a, 36b and 40 of the other semiconductor substrates (silicon bodies) 5, 7 and 9 as shown in FIG. 3, the area of the corner portion of the first semiconductor substrate 3 including the potential drawing portion 31 is larger than the area of each of the potential drawing portions 36a, 36b and 40 of the other semiconductor substrates 5, 7 and 9.

On the other hand, in the second preferred embodiment, an area of a portion protruding towards the inside, as the potential drawing portion 31, from the first semiconductor substrate 3 formed like an outer peripheral frame, serving as an outer peripheral frame portion, is set smaller than the area of each of the potential drawing portions 36a, 36b and 40 of the other semiconductor substrates 5, 7 and 9, and the area of the corner portion of the first semiconductor substrate 3 including the potential drawing portion 31 is set almost equal to the area of each of the potential drawing portions 36a, 36b and 40 of the other semiconductor substrates 5, 7 and 9.

Figure 9:
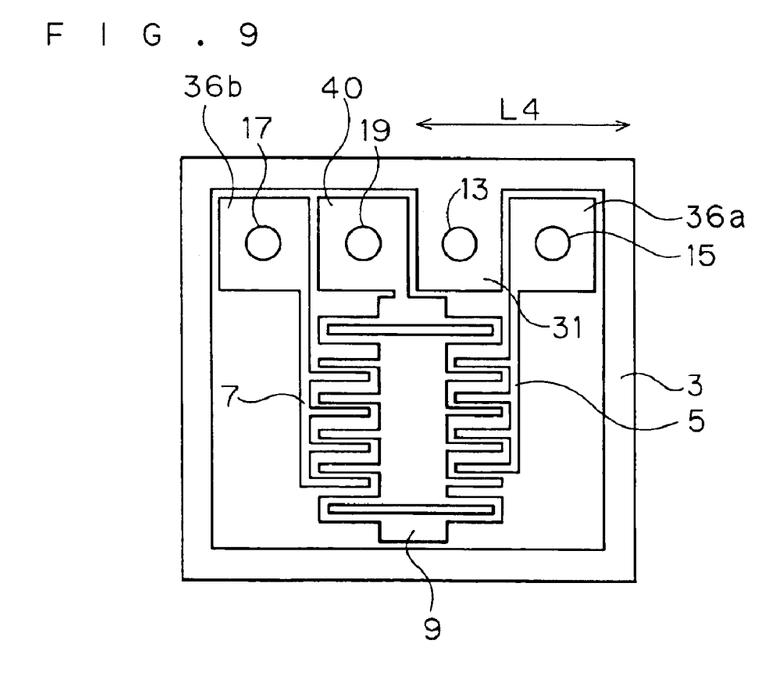
FIG. 9 is a plan view showing another example with the upper substrate removed.

As shown in FIG. 8, since the potential drawing portion 31 is formed at a corner portion of the first semiconductor substrate 3 and the area of the corner portion of the first semiconductor substrate 3 including the potential drawing portion 31 is set almost equal to the area of each of the potential drawing portions 36a, 36b and 40 of the other semiconductor substrates 5, 7 and 9, the chip size becomes smaller than that, e.g., in a case where the potential drawing portion 31 is formed at an intermediate position of the first semiconductor substrate 3, other than corner portions, as shown in FIG. 9.

Specifically, a distance L3 (FIG. 8) and a distance L4 (FIG. 9) from an end portion of the microstructure to the second potential drawing region are compared. In FIG. 9, since the potential drawing portion 36a of the second semiconductor substrate 5 is positioned near a corner portion of the microstructure, it becomes necessary to space the potential drawing portion 36a and the first semiconductor substrate 3. For this reason, a length from the end portion of the microstructure to the potential drawing portion 31 in the second position therefrom is L4. On the other hand, in FIG. 8, since the potential drawing portion 31 is formed at a corner portion of the first semiconductor substrate 3, being pulled in, and the area of the corner portion of the first semiconductor substrate 3 including the potential drawing portion 31 is set almost equal to the area of each of the potential drawing portions 36a, 36b and 40 of the other semiconductor substrates 5, 7 and 9, a length from the end portion of the microstructure to the potential drawing portion 36a in the second position therefrom is L3 which is smaller than L4. Therefore, the second preferred embodiment can achieve further reduction in chip size, compared with the case of FIG. 9.

The Third Preferred Embodiment

Figure 10:
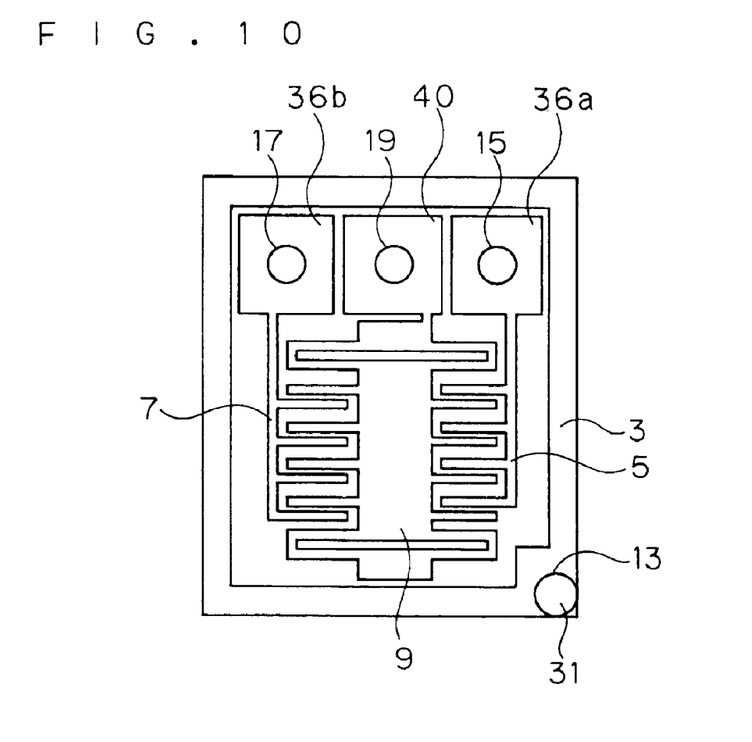
FIG. 10 is a plan view showing a microstructure in accordance with a third preferred embodiment of the present invention with the upper substrate removed.

FIG. 10 is a plan view showing a semiconductor device (microstructure) in accordance with the third preferred embodiment of the present invention with the upper substrate removed. In FIG. 10, constituent elements having the same functions as those of the first and second preferred embodiments are represented by the same reference signs.

While the potential drawing portion 31 of the first semiconductor substrate (silicon body) 3 serving as an outer peripheral frame portion is formed at a corner portion in the potential drawing region 23 linearly defined in the microstructure in the above second preferred embodiment, the potential drawing portion 31 of the first semiconductor substrate (silicon body) 3 serving as an outer peripheral frame portion is not disposed on a position in a line with respect to the potential drawing portions 36a, 36b and 40 of the other semiconductor substrates (silicon bodies) 5, 7 and 9 but disposed at any one of corner portions on a dicing line (in other words, on a line of cutting for division) of the microstructure in the third preferred embodiment. Thus, if the potential drawing portion 31 of the first semiconductor substrate 3 is disposed across the corner portion on the dicing line of the microstructure, when the dicing line is cut, the potential drawing portion 31 of the first semiconductor substrate 3 is disposed in a rim portion of the microstructure. The potential drawing portion 31 of the first semiconductor substrate 3 can be thereby disposed in a region where the semiconductor substrates 5, 7 and 9 are not close-packed, avoiding a portion where the semiconductor substrates 5, 7 and 9 are relatively close-packed, and therefore it is possible to achieve reduction in chip size by leveling of density on the whole.

Figure 11:
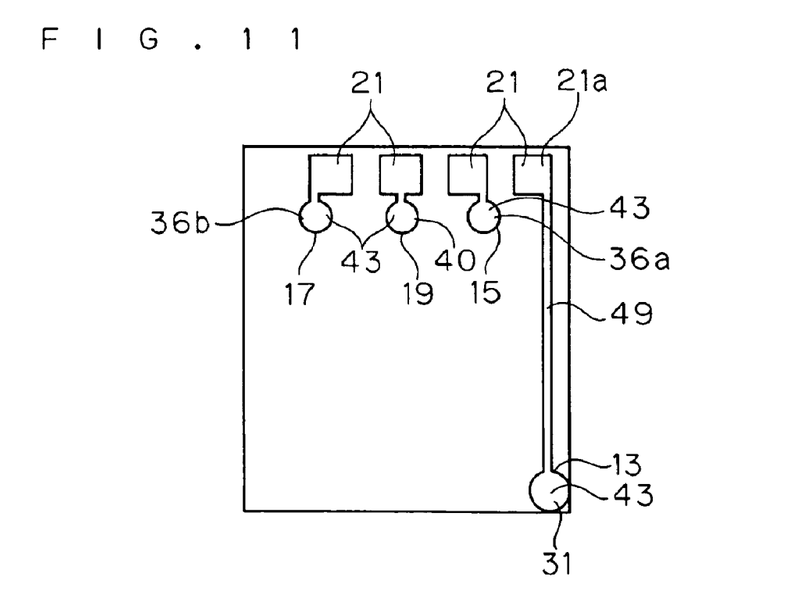
FIG. 11 is a plan view showing the microstructure in accordance with the third preferred embodiment of the present invention.

Though only the potential drawing portion 31 of the first semiconductor substrate 3 is disposed isolatedly away from the potential drawing portions 36a, 36b and 40 of the other semiconductor substrates 5, 7 and 9 in the above structure, it is preferable that a plurality of bonding pad portions 21 to which the bonding wires 47 are connected should be disposed adjacently to one another in a line as shown in FIG. 11, like in the first and second preferred embodiments, considering convenience of automatic connection or the like. Therefore, an interconnection layer 49 interconnecting the potential drawing portion 31 of the first semiconductor substrate 3 which is isolatedly disposed to the bonding pad portion 21 (21a) therefor is made longer than the interconnection layers 43 interconnecting the potential drawing portions 36a, 36b and 40 of the other semiconductor substrates 5, 7 and 9 to the bonding pad portions 21 therefor.

Further, while the area of a corner portion of the first semiconductor substrate 3 including the potential drawing portion 31 is set almost equal to the area of each of the potential drawing portions 36a, 36b and 40 of the other semiconductor substrates 5, 7 and 9 in the second preferred embodiment, it is possible in the third preferred embodiment to set the area of the corner portion of the first semiconductor substrate 3 including the potential drawing portion 31 smaller than the area of each of the potential drawing portions 36a, 36b and 40 of the other semiconductor substrates 5, 7 and 9 since the potential drawing portion 31 is provided across the dicing line and after cutting the dicing line, the potential drawing portion 31 is disposed in the rim portion of the microstructure. Therefore, the third preferred embodiment allows further reduction in chip size, as compared with the second preferred embodiment.

Figure 12:
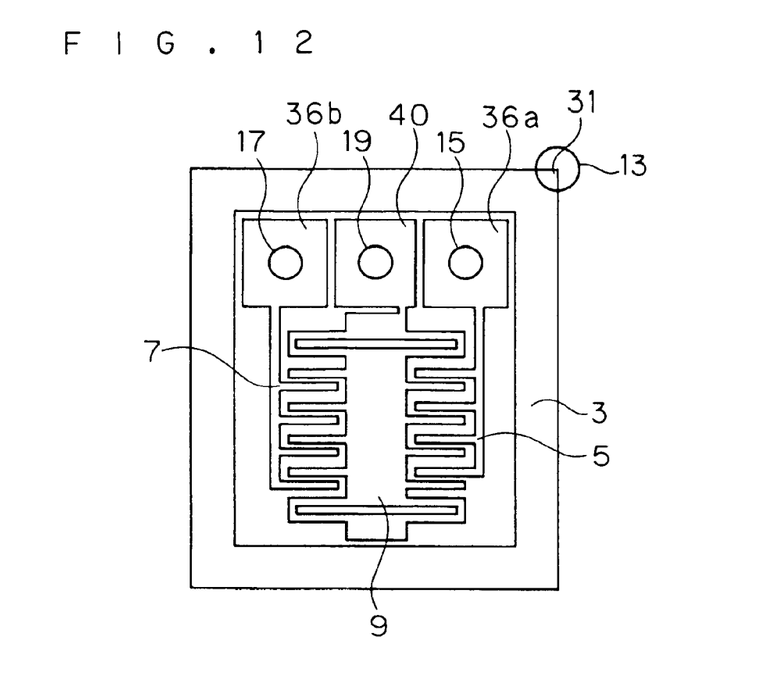
FIGS. 12 and 13 are plan views each showing another example of the microstructure in accordance with the third preferred embodiment of the present invention with the upper substrate removed.

The position of the potential drawing portion 31 of the first semiconductor substrate 3 is not limited to the position shown in FIG. 10. For example, there may be a case, as shown in FIG. 12, where the potential drawing portion 31 is disposed at a position across the dicing line of the microstructure, near the position of the potential drawing portion 31 of the first semiconductor substrate 3 in the second preferred embodiment, and the area of the potential drawing portion 31 is limited to the width of the outer peripheral frame portion as the first semiconductor substrate 3. In this case, the through hole 13 may be formed across a corner end portion of the first semiconductor substrate 3 on the dicing line to be extended off.

Figure 13:
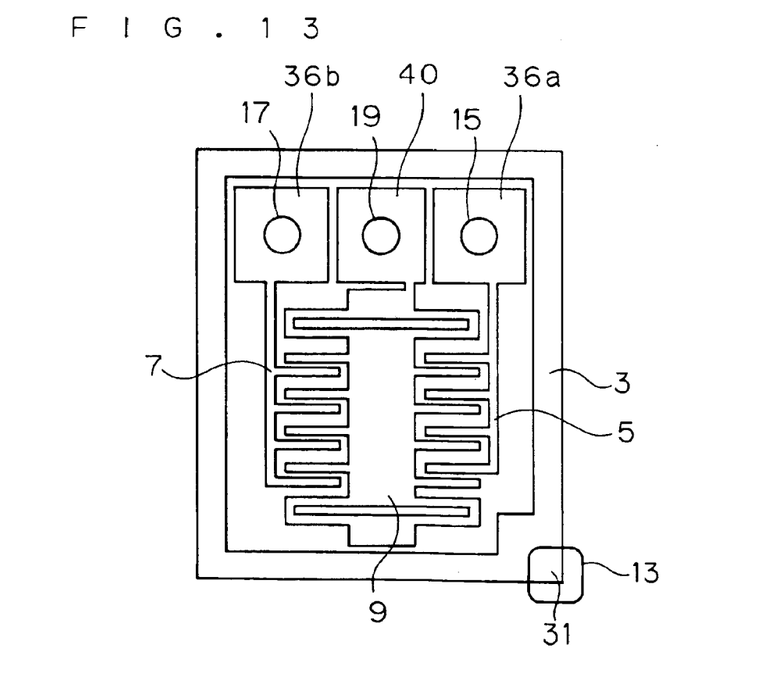

Alternatively, there may be another case, as shown in FIG. 13, where the potential drawing portion 31 of the first semiconductor substrate 3 is disposed across the dicing line near the position shown in FIG. 10 and the through hole 13 is formed across the corner end portion of the first semiconductor substrate 3 on the dicing line to be extended off.

Figure 14:
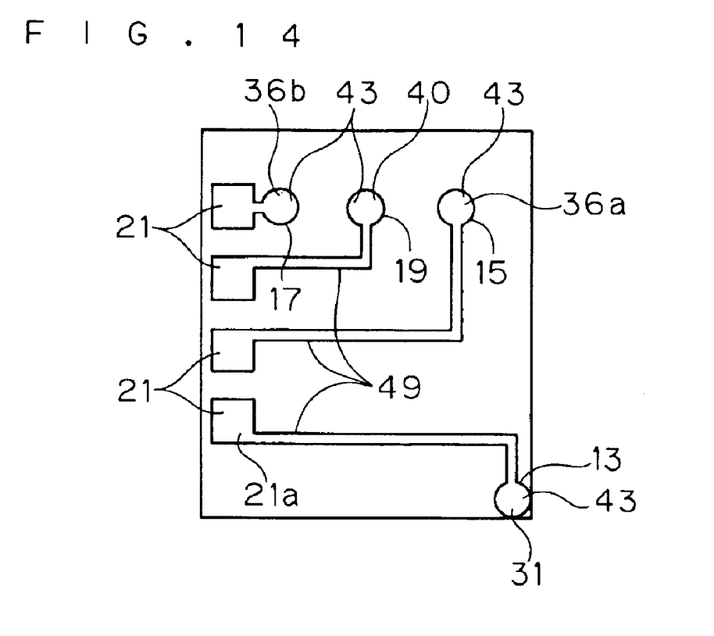
FIG. 14 is a plan view showing another exemple of the microstructure in accordance with the third of the present invention.

Further, the shapes of the interconnection layers 43 and 49 on the upper substrate 1 are not limited to those shown in FIG. 11, but the interconnection layers 49 may be patterned in various shapes such as shown in FIG. 14, with which the bonding pad portions 21 are disposed on desired positions.

The Fourth Preferred Embodiment

Figure 15:
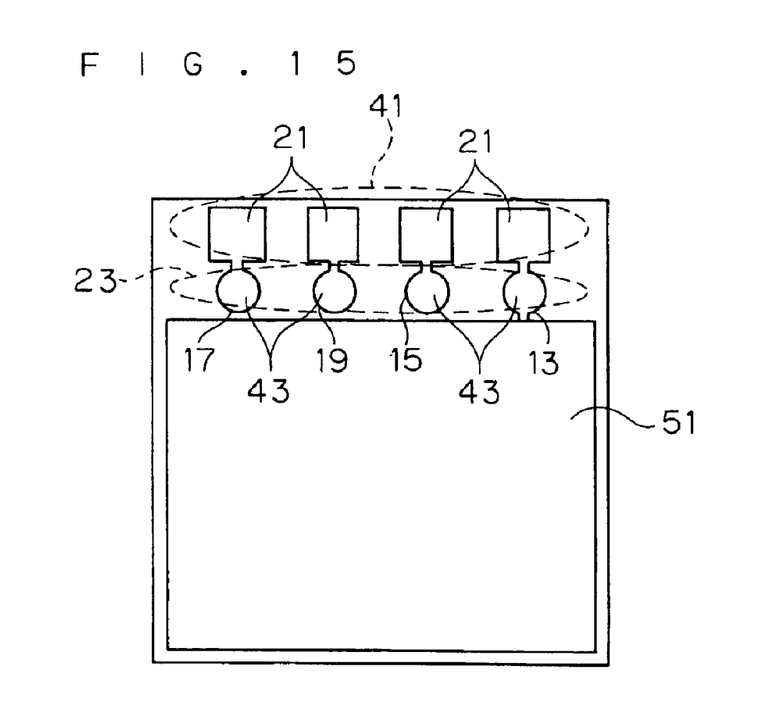
FIG. 15 is a plan view showing a microstructure in accordance with a fourth preferred embodiment of the present invention.

FIG. 15 is a plan view showing a semiconductor device (microstructure) in accordance with the fourth preferred embodiment of the present invention. In FIG. 15, constituent elements having the same functions as those of the first to third preferred embodiments are represented by the same reference signs.

In the microstructure of the fourth preferred embodiment, as shown in FIG. 15, the interconnection layer 43 drawing out from the first semiconductor substrate (silicon body) 3 having a ground (GND) potential to the bonding pad portion 21 is connected to a conductive layer 51 which is extended in a region (hereinafter, referred to as a "shield region") other than the potential drawing region 23 and the connection region (potential drawing portion) 41 on the surface of the upper substrate 1, to thereby fix a surface potential of the conductive layer 51 on the upper substrate 1 to the ground potential.

By forming the conductive layer 51, it is possible to achieve a high-performance product which causes no variation in capacitance due to disturbance such as proximity of other substances, static electricity or radio wave hindrance.

Figure 16:
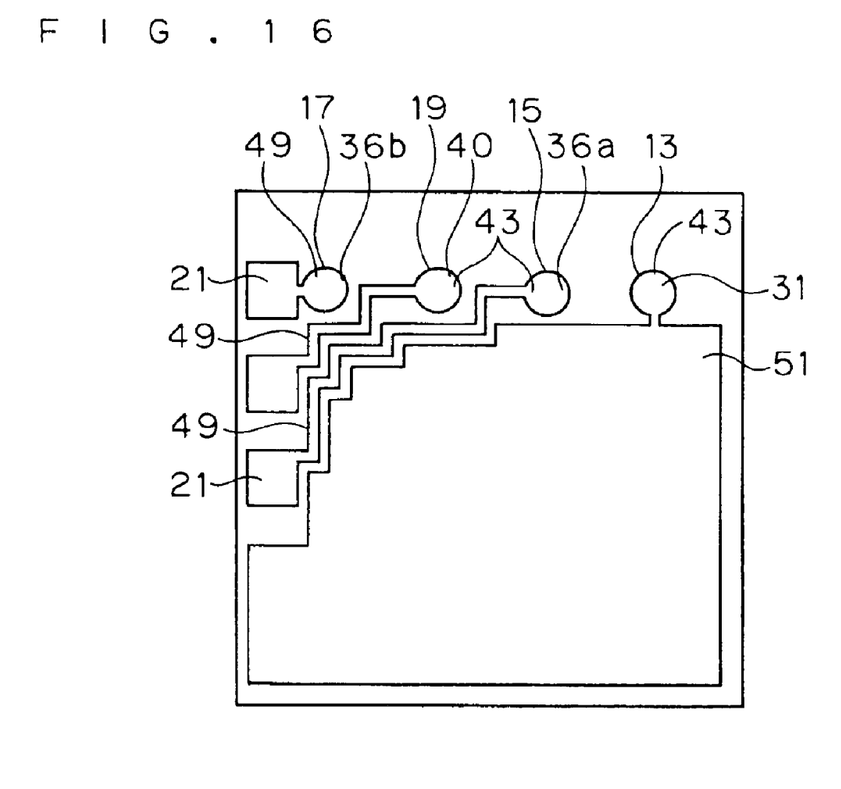
FIG. 16 is a plan view showing another exemple of the microstructure in accordance with the fourth preferred embodiment of the present invention.

The shapes of the interconnection layers 43 and 49 and the conductive layer 51 are not limited to those shown in FIG. 15 but may be defined by patterning, for example, as shown in FIG. 16.

Further, the potential of the conductive layer 51 is not limited to the ground (GND) potential but only has to be set to a predetermined fixed potential.

The Fifth Preferred Embodiment

Figure 17:
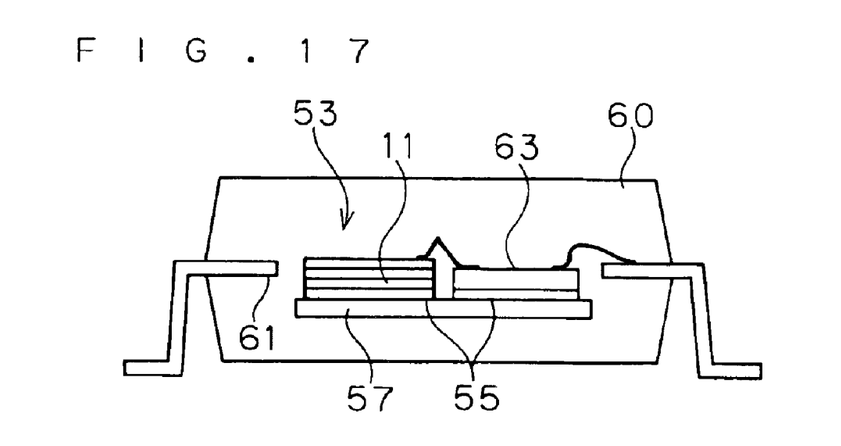
FIG. 17 is a side sectional view showing a semiconductor device in accordance with a fifth preferred embodiment of the present invention.

FIG. 17 is a side sectional view showing a semiconductor device using a microstructure in accordance with the fifth preferred embodiment of the present invention. In FIG. 17, constituent elements having the same functions as those of the first to fourth preferred embodiments are represented by the same reference signs.

In the semiconductor device of the fifth preferred embodiment, as shown in FIG. 17, a lower surface of the lower substrate 11 of a microstructure 53 is die-bonded to an upper surface of a die pad 57 with a predetermined conductive member 55 interposed therebetween.

As the conductive member 55 used is a conductive resin in which a metal such as silver is mixed into a resin material such as an epoxy resin, a solder, an Au-Si eutectic metal or the like.

Figure 18:
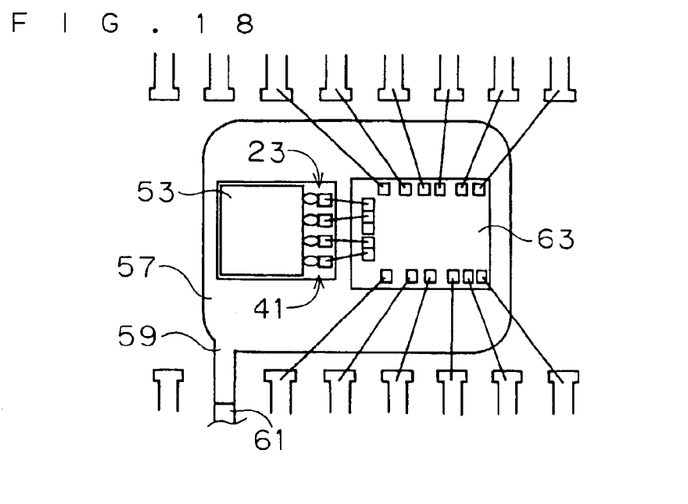
FIG. 18 is a plan view showing the semiconductor device in accordance with the fifth preferred embodiment of the present invention.

The die pad 57 is a conductive plate using a predetermined metal material. A potential of the die pad 57 is fixed to a ground potential or a constant voltage. Specifically, the potential of the die pad 57 is connected to an external lead 61, a semiconductor element 63 such as an ASIC or the like through an inner lead 59, as shown in FIG. 18.

Reference numeral 60 represents an insulative mold formed of an insulating resin such as an epoxy resin.

With this constitution, it is possible to achieve a high-performance product which causes no variation in capacitance due to disturbance such as proximity of other substances, static electricity or radio wave hindrance on the lower side of the microstructure 53, as compared with a case where the microstructure 53 is die-bonded to the die pad 57 of an insulator.

Further, as shown in FIG. 17, by metalizing a back surface of the semiconductor element 63 which is disposed adjacently to the microstructure 53 with the same conductive member 55, it is possible to make a potential at the die pad 57 on the lower surface of the lower substrate 11 of the microstructure 53 equal to a potential of the lower surface of a substrate of the semiconductor element 63. Therefore, it is possible to achieve a high-performance product, including the semiconductor element 63, which causes no variation in capacitance due to disturbance such as proximity of other substances, static electricity or radio wave hindrance.

Figure 19:
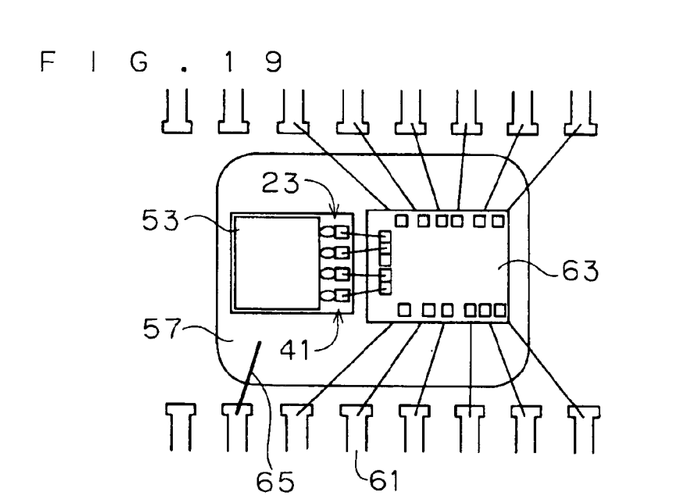
FIG. 19 is a plan view showing another exemple of the semiconductor device in accordance with the fifth preferred embodiment of the present invention.

The potential of the die pad 57 is drawn out by using the inner lead 59 in FIG. 18, and besides, the potential of the die pad 57 may be drawn out through a bonding wire 65 which is connected to a predetermined position of the die pad 57 as shown in FIG. 19.

The Sixth Preferred Embodiment

Figure 20:
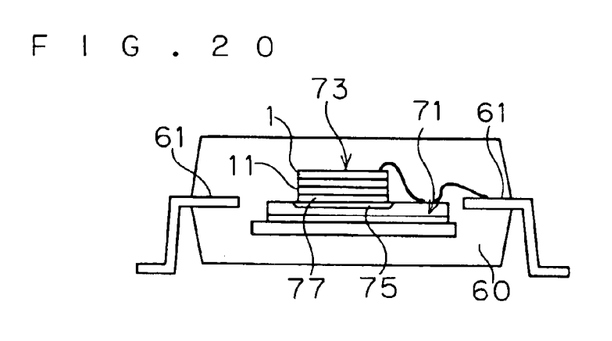
FIG. 20 is a side sectional view showing a semiconductor device in accordance with a sixth preferred embodiment of the present invention.

FIG. 20 is a side sectional view showing a semiconductor device using a microstructure in accordance with the sixth preferred embodiment of the present invention. In FIG. 20, constituent elements having the same functions as those of the first to fifth preferred embodiments are represented by the same reference signs.

The semiconductor device of the sixth preferred embodiment has a stacked structure where a microstructure 73 is layered on an upper surface of a semiconductor element 71 such as an ASIC for signal processing circuit, in which a conductive layer 75 is formed in a surface region of the semiconductor element 71 on which the microstructure 73 is layered and the microstructure 73 is die-bonded to the semiconductor element 71 with a conductive member 77 which is formed on an upper surface of the conductive layer 75 interposed therebetween.

A potential of the conductive layer 75 of the semiconductor element 71 is fixed to a ground potential or a constant voltage.

As the conductive member 77 used is a conductive resin in which a metal such as silver is mixed into a resin material such as an epoxy resin, a solder, an Au—Si eutectic metal or the like.

With this constitution, it is possible to achieve a high-performance product which causes no variation in capacitance due to disturbance such as proximity of other substances, static electricity or radio wave hindrance on the side of the lower substrate 11 of the microstructure 73, like in the fifth preferred embodiment.

The Seventh Preferred Embodiment

Figures 21, 22:
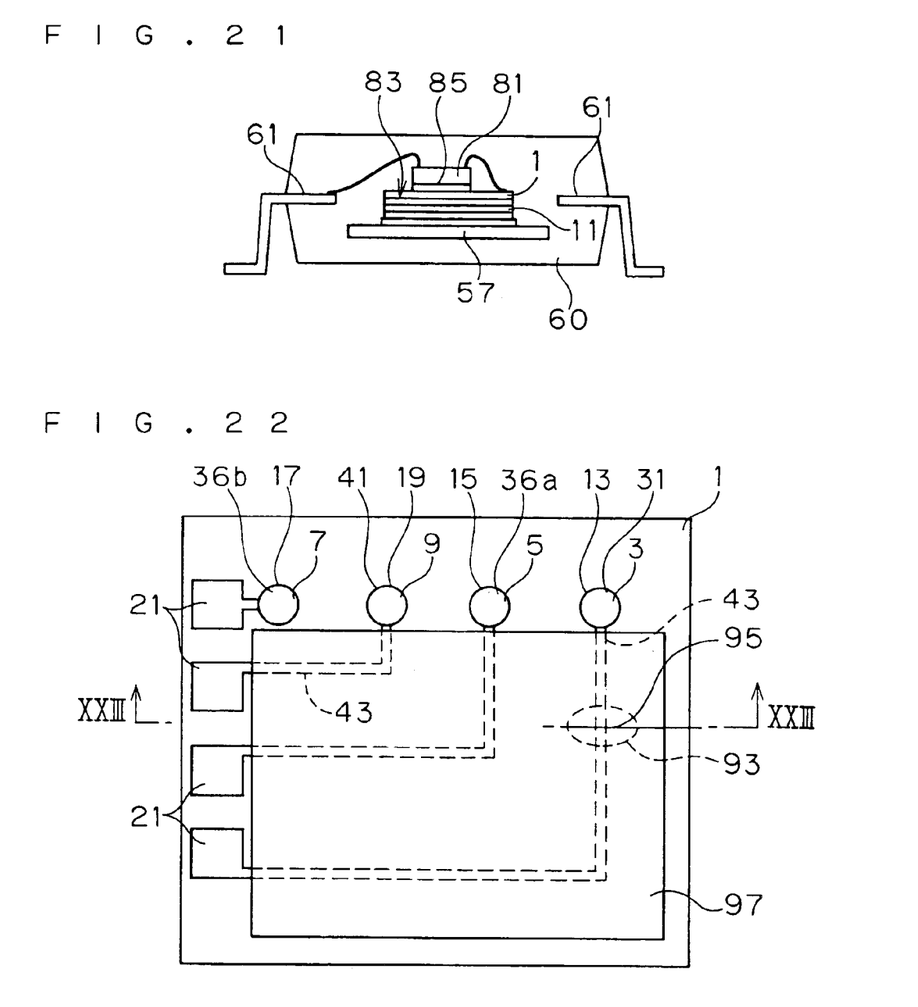
FIG. 21 is a side sectional view showing a semiconductor device in accordance with a seventh preferred embodiment of the present invention.
FIG. 22 is a plan view showing a microstructure in accordance with an eighth preferred embodiment of the present invention.

FIG. 21 is a side sectional view showing a semiconductor device using a microstructure in accordance with the seventh preferred embodiment of the present invention. In FIG. 21, constituent elements having the same functions as those of the first to sixth preferred embodiments are represented by the same reference signs.

The semiconductor device of the seventh preferred embodiment has a stacked structure where a microstructure 83 is mounted on the die pad 57 and a semiconductor element 81 such as an ASIC for signal processing circuit is layered on the upper surface of the upper substrate 1 of the microstructure 83, in which the upper substrate 1 of the microstructure 83 is die-bonded to the semiconductor element 81 with a conductive member 85 interposed therebetween. As the conductive member 85 used is a conductive resin in which a metal such as silver is mixed into a resin material such as an epoxy resin, a solder, an Au—Si eutectic metal or the like.

A potential of the conductive substrate 85 of the semiconductor element 81 is fixed to a ground potential or a constant voltage.

This constitution makes it possible to fix the potential of the lower surface of the lower substrate 11 of the microstructure 83 and thereby produces the same effect of that of the fifth preferred embodiment.

The Eighth Preferred Embodiment

Figure 23:
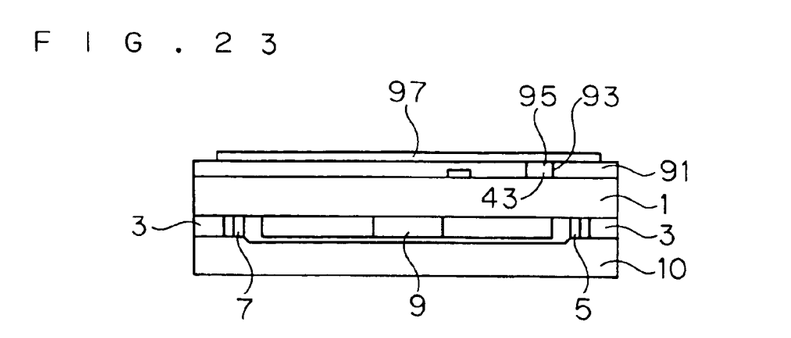
FIG. 23 is a side sectional view showing the microstructure in accordance with the eighth preferred embodiment of the present invention.

FIG. 22 is a plan view showing a microstructure in accordance with the eighth preferred embodiment of the present invention, and FIG. 23 is a cross section taken along the line XXIII—XXIII of FIG. 22. In FIGS. 22 and 23, constituent elements having the same functions as those of the first to seventh preferred embodiments are represented by the same reference signs.

In the microstructure of the eighth preferred embodiment, like those of the first to third preferred embodiments, the semiconductor substrates (silicon bodies) 3, 5, 7 and 9 serving as the fixed electrode and the variable electrode are provided between the upper substrate 1 and the lower substrate 11 which are disposed in parallel to each other, the through holes 13, 15, 17 and 19 are formed at some portions of the upper substrate 1 and the respective potential drawing portions 31, 36a, 36b and 41 of the semiconductor substrates 3, 5, 7 and 9 are electrically connected to the die bonding pad portions 21 on the upper substrate 1 through the interconnection layers 43 formed in the surface of the upper substrate 1, extending from bottoms of the through holes 13, 15, 17 and 19.

Then, an insulating film 91 is formed in a further upper layer of the upper substrate 1 in a state where the interconnection layers 43 are formed. As the insulating film 91 used is a nitride film, a polyimide film or the like, which can be layered at a low temperature.

A wire drawing hole 93 is bored in the insulating film 91 at a position corresponding to an intermediate position of the interconnection layer 43 drawn from the first semiconductor substrate 3 which is fixed to the ground (GND) potential through the through hole 13. The wire drawing hole 93 is filled with a conductor 95 using a conductive resin in which a metal such as silver is mixed into a resin material such as an epoxy resin, a solder, an Au—Si eutectic metal or the like, and with this conductor 95, the potential (ground potential) of the first semiconductor substrate 3 is drawn out on the upper surface side of the insulating film 91.

The above conductor 95 of ground potential is connected to the upper surface of the insulating film 91, to form a conductive layer 97 which prevents variation in capacitance due to disturbance such as proximity of other substances, static electricity or radio wave hindrance. The conductive layer 97 is formed in a desired shield region covering most part of the interconnection layers 43.

This constitution makes it possible to fix the potential of the upper side of the microstructure including the interconnection layers 43 and thereby achieves a high-performance product which causes no variation in capacitance due to disturbance such as proximity of other substances, static electricity or radio wave hindrance.

Though the conductive layer 97 formed in the shield region has a ground potential since the first semiconductor substrate 3 has a ground potential in the eighth preferred embodiment, it is natural to produce the same effect even if the first semiconductor substrate 3 is fixed to a predetermined fixed potential other than the ground potential and the conductive layer 97 is fixed to the fixed potential.

The Ninth Preferred Embodiment

Figure 24:
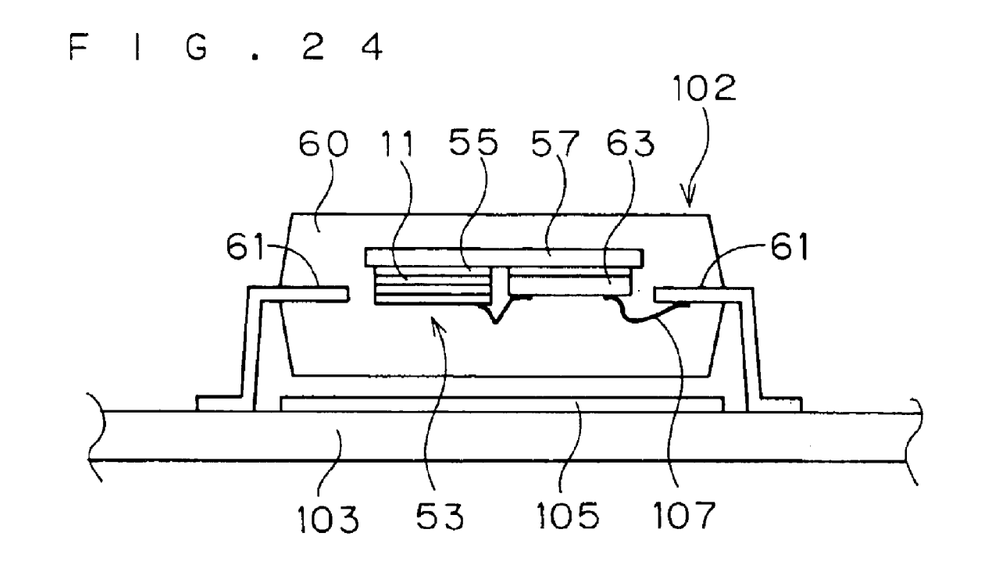
FIG. 24 is a side sectional view showing a microstructure in accordance with a ninth preferred embodiment of the present invention.

FIG. 24 is a side sectional view showing a semiconductor device using a microstructure in accordance with the ninth preferred embodiment of the present invention. In FIG. 24, constituent elements having the same functions as those of the fifth preferred embodiment are represented by the same reference signs.

The semiconductor device of the ninth preferred embodiment is the same as that of the fifth preferred embodiment in that the back surface of the lower substrate 11 of the microstructure 53 is die-bonded to the conductive die pad 57 with the predetermined conductive member 55 interposed therebetween, as shown in FIG. 24.

As the conductive member 55 used is a conductive resin in which a metal such as silver is mixed into a resin material such as an epoxy resin, a solder, an Au—Si eutectic metal or the like, like that of the fifth preferred embodiment.

The die pad 57 is also a conductive plate using a predetermined metal material like that of the fifth preferred embodiment and the potential of the die pad 57 is fixed to a ground potential or a constant voltage.

Reference numeral 63 of FIG. 24 represents a semiconductor element such as an ASIC.

In the ninth preferred embodiment, as shown in FIG. 24, the microstructure 53 is disposed in vertically inverse relation to that of the fifth preferred embodiment as shown in FIG. 17, in other words, turned upside down, and further all the circuits are mounted in reverse bent by wire-bonding of the respective lower sides of the external lead 61 and the semiconductor element 63 with a bonding wire 101 for connecting these elements 61 and 63. All the circuits and the upper side of the microstructure 53 and the semiconductor element 63 are thereby shielded with the conductive die pad 57.

Thus, with the die pad 57 which is fixed to a ground potential or a constant voltage, it is possible to prevent variation in capacitance due to disturbance such as proximity of other substances from the upper side, static electricity or radio wave hindrance.

Further, in the ninth preferred embodiment, a conductive layer 105 is formed on a surface of a printed circuit board 103 on which a semiconductor device 102 is mounted, which faces the semiconductor device 102, and the lower side of the semiconductor device 102 is shielded with the conductive layer 105. With this conductive layer 105, it is possible to prevent variation in capacitance due to disturbance such as proximity of other substances from the lower side, static electricity or radio wave hindrance.

With this constitution, it is possible to prevent variation in capacitance due to disturbance such as proximity of other substances from both the upper and lower sides, static electricity or radio wave hindrance and achieve a high-performance product.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

an upper substrate on which a plurality of through holes are formed;

a lower substrate; and a plurality of semiconductor substrates provided between said upper substrate and said lower substrate, said plurality of semiconductor substrates forming a fixed electrode and a variable electrode, and each having a potential drawing portion, abutting on said through holes to draw potentials, wherein one of said plurality of semiconductor substrates is so formed as to surround a periphery of a region between said upper substrate and said lower substrate, to form an outer peripheral frame, the others of said plurality of semiconductor substrates are disposed, being surrounded by an inner periphery of said outer peripheral frame formed by said one semiconductor substrate, and said potential drawing portion of said one semiconductor substrate is formed at a corner portion thereof.

2. The semiconductor device according to claim 1, further comprising:

a plurality of bonding pad portions formed on a surface of said upper substrate to draw to bonding wires potentials drawn from said potential drawing portions of said semiconductor substrates to said upper substrate through said through holes.

3. The semiconductor device according to claim 1, wherein said potential drawing portions are disposed on an end portion.

4. The semiconductor device according to claim 1, wherein a conductive layer is formed on a surface of said upper substrate, being fixed to a predetermined fixed voltage to shield said semiconductor substrates against disturbance such as proximity of other substances, static electricity or radio wave hindrance.

5. The semiconductor device according to claim 1, wherein said one semiconductor substrate is fixed to a predetermined fixed potential.

6. The semiconductor device according to claim 4, wherein said one semiconductor substrate is fixed to a predetermined fixed potential, and said conductive layer is connected to said one semiconductor substrate to be fixed to said fixed potential.

7. The semiconductor device according to claim 1, wherein a back surface of said lower substrate is die-bonded onto a conductive die pad with a predetermined conductive member interposed therebetween.

8. The semiconductor device according to claim 1, wherein a signal processing semiconductor element is mounted on a surface of said upper substrate, and a substrate of said semiconductor element joined onto said surface of said upper substrate is fixed to a predetermined fixed potential.

9. The semiconductor device according to claim 2, further comprising:

interconnection layers wired on said surface of said upper substrate to interconnect said through holes and said bonding pad portions, respectively;

an insulating film covering said surface of said upper substrate on which said interconnection layers are wired; and a conductive layer formed in an upper side of said insulating film, being fixed to a predetermined fixed potential to shield said semiconductor substrates and said interconnection layers against disturbance such as proximity of other substances, static electricity or radio wave hindrance.

* * * * *